US006482269B1

(12) United States Patent
Shive et al.

(10) Patent No.: US 6,482,269 B1
(45) Date of Patent: Nov. 19, 2002

(54) PROCESS FOR THE REMOVAL OF COPPER AND OTHER METALLIC IMPURITIES FROM SILICON

(75) Inventors: Larry W. Shive, St. Peters, MO (US); Carissima M. Vitus, St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 376 days.

(21) Appl. No.: 09/082,906

(22) Filed: May 21, 1998

Related U.S. Application Data

(60) Provisional application No. 60/047,874, filed on May 29, 1997.

(51) Int. Cl.⁷ ............................................... C23G 1/02
(52) U.S. Cl. ........................................................ 134/3
(58) Field of Search .................. 423/1, 659; 134/3, 134/28, 41, 42; 510/175

(56) References Cited

U.S. PATENT DOCUMENTS

| | | | | |
|---|---|---|---|---|
| 5,272,119 A | | 12/1993 | Falster | 437/247 |
| 5,294,570 A | * | 3/1994 | Fleming, Jr. et al. | 134/3 |
| 5,489,557 A | * | 2/1996 | Jolley | 134/28 |
| 5,509,970 A | * | 4/1996 | Shiramizu | 134/2 |
| 5,681,397 A | * | 10/1997 | Li | 134/3 |
| 5,714,203 A | * | 2/1998 | Schellenberger et al. | 134/3 |
| 5,814,157 A | * | 9/1998 | Mizuniwa et al. | 134/3 |

FOREIGN PATENT DOCUMENTS

| | | |
|---|---|---|
| DE | 39 39 661 A1 | 6/1991 |
| EP | 0 252 262 A2 | 5/1987 |
| EP | 0 702 400 A2 | 5/1993 |
| EP | 0 690 482 A2 | 5/1995 |
| JP | 59-125760 | 6/1984 |

OTHER PUBLICATIONS

G. Ewing "Instrumental Methods of Chemical Analysis" McGraw–Hill Book Company, (1985) pp. 109–121, 160–175, 395–426.

A. Mesli et al. "Copper Related Defect Reactions in P–Type Silicon" Materials Science Forum, vol. 83–87 (1992) pp. 161–166.

TH. Prescha et al. "Interaction of a Copper–Induced Defect With Shallow Acceptors and Deep Centers in Silicon" Materials Science Forum, vol. 83–87 (1992) pp. 167–172.

H. Prigge et al. "Acceptor Compensation in Silicon Induced by Chemomechanical Polishing" J. Electrochem. Soc., vol. 138, No. 5 (May 1991) pp. 1385–1389.

A. Schnegg et al. "Effects in Silicon Explained by Atomic Hydrogen" Mat. Res. Soc. Symp. Proc., vol. 104 (1988) p. 291–296.

M. Shabani et al. "Low–Temperature Out–Diffusion of Cu from Silicon Wafers" J. Electrochem. Soc., vol. 143, No. 6 (Jun. 1996) pp. 2025–2029.

F. Shimura "Semiconductor Silicon Crystal Technology" Academic Press, Inc. (1989) pp. 188–191 and Appendix XII.

D. Chopra et al. "Cu Dissolution from Si(111) into an SC–1 Process Solution" Journal of Electrochemical Society, vol. 145, No. 4 (Apr. 1998) pp. L60–L61.

T. Imaoka et al. "The Segregation and Removal of Metallic Impurities at the Interface of Silicon Wafer Surface and Liquid Chemicals" IEICE Transactions on Electronics, vol. E75–C, No. 7 (Jul. 1992) pp. 816–828.

T. Ohnishi et al. "Multipurpose Cleaning by $H_2SO_4/H_2O_2/$ HF Solution" Abstract from the International Conference on Solid State Devices and Materials, Tokyo, Japan (Aug. 1993), pp. 627–629.

* cited by examiner

*Primary Examiner*—Steven Bos
(74) *Attorney, Agent, or Firm*—Senniger, Powers, Leavitt & Roedel

(57) ABSTRACT

A process for removing a metallic contaminant from a nonpatterned silicon wafer. In the process, the wafer is annealed by immersing it for at least about 0.1 hours in an acidic solution which is heated to a temperature of at least about 125° C. in order to diffuse the metal to the surface of the wafer. As the diffused metal reaches the wafer surface, it is oxidized and complexed by the acidic solution and removed from the wafer surface.

24 Claims, 1 Drawing Sheet

PROCESS FOR THE REMOVAL OF COPPER AND OTHER METALLIC IMPURITIES FROM SILICON

REFERENCE TO RELATED APPLICATIONS

This is a non-provisional application based upon provisonal application Ser. No. 60/047,874, filed May 29, 1997.

BACKGROUND OF THE INVENTION

The present invention relates generally to a process for removing copper and other metal contaminants which are present in silicon wafers and, more particularly, to a process for diffusing copper and other metals to the surface of such wafers from which it can be removed while avoiding the formation of copper and other metallic silicide precipitates.

Silicon device performance is degraded by metallic contaminants. Transition metals, including copper, iron and nickel, will dissolve and diffuse during the normal thermal cycles associated with integrated circuit manufacturing conditions. While cooling from these high temperatures, these and other metals may precipitate or concentrate at the surface of the wafer, as well as at interfaces, defect sites, and highly doped regions of the wafer. These precipitates often result in the formation of dislocations and other defects. The precipitates and their associated dislocations and defects, if present in the device fabrication region of the wafer, may render integrated circuits prepared from the wafer useless.

Gettering techniques have been used in an effort to reduce or eliminate the concentration of metallic contaminants in the bulk of a silicon wafer. Such techniques involve the introduction of defect sites into the silicon wafer at locations which do not disturb the functioning of integrated circuits fabricated from the wafer. Gettering techniques, however, are not without limitations. For example, for relatively fast diffusing metals such as copper and nickel, exposure to high fabrication temperatures may enable these metals to escape from gettering sites and reach the device region. Additionally, the defects introduced into silicon as gettering sinks can themselves reduce the quality of silicon, for example, by reducing minority carrier recombination lifetime.

Due to the problems associated with the presence of metallic contaminants, as well as the limitations associated with existing means by which to remove these contaminants, industry has primarily focused its attention on identifying and eliminating, to the extent possible, the sources of these contaminants. Such an approach has become increasingly more costly, however, due to the ever more stringent limitations being placed upon metallic contaminant levels in silicon wafers by integrated circuit manufactures. For example, integrated circuit manufacturers typically require that the concentration of copper contaminants on the surface of silicon wafers be no more than $1 \times 10^{10}$ to $1 \times 10^{11}$ atoms/$cm^2$. It is foreseeable that this requirement will become approximately $1 \times 10^9$ atoms/$cm^2$ or less since a large fraction of random device failures can be traced to copper silicide precipitates. Under appropriate conditions, copper reacts with silicon to form a copper silicide precipitate, sometimes referred to as haze defects because, upon being subjected to a common etching treatment and bright light inspection, such defects appear as a haze on the surface of the wafer.

The manufacture of silicon wafers involves a number of steps which are potential sources for the introduction of metallic contaminants, such as wafer polishing. As a result, a need continues to exist for a process which affords both an efficient and effective means by which to remove metallic contaminants from the wafer while preventing the formation of harmful precipitates.

SUMMARY OF THE INVENTION

Among the objects of the present invention, therefore, may be noted the provision of a process for removing metallic contaminants from a nonpatterned silicon wafer; and the provision of a process in which metallic contaminants are oxidized, complexed and, as such, removed after being diffused to the surface of a wafer.

Briefly, therefore, the present invention is directed to a process for removing a metallic contaminant from a nonpatterned silicon wafer by immersing the wafer in an acidic solution heated to at least about 125° C. for at least about 0.1 hours in order to diffuse the metal to the wafer surface, oxidizing and complexing the diffused metal at the wafer surface, and removing the oxidized metal complex from the wafer surface.

The present invention is further directed to a process for removing a metallic contaminant from a nonpatterned silicon wafer by immersing the wafer in an acidic solution heated to at least about 150° C. in order to diffuse the metal to the wafer surface, oxidizing and complexing the diffused metal at the wafer surface, and removing the oxidized metal complex from the wafer surface.

Other objects and features of this invention will be in part apparent and in part pointed out hereinafter.

BRIEF DESCRIPTION OF THE DRAWINGS

FIG. 1 is a chart which illustrates, as described in the Example, the differences in the concentration of copper on the surface and very near surface (i.e., about 0.01 micron from the surface) of a test set (denoted "hot acid") and a control set (denoted "control") of silicon wafers, as determined by AA (atomic absorption) and ICP/MS (inductively coupled plasma/mass spectroscopy) methods of analysis.

DETAILED DESCRIPTION OF THE PREFERRED EMBODIMENTS

Without being bound to any particular theory, it is believed that copper forms some sort of complex with boron and is incorporated or "stored" in this form in boron doped silicon wafers. It is additionally believed that these copper-boron complexes are meta-stable, even at room temperature. As time passes, therefore, these complexes dissociate allowing copper to assume an interstitial position. Copper is a rapid diffuser in silicon; the most rapid of all metals and is very mobile even at room temperature. In addition, however, its solubility in silicon is strongly temperature dependent and at low temperatures, e.g., room temperature, it is very low. At low temperatures, therefore, interstitial copper will rapidly diffuse to the surface of the wafer.

The increase in the concentration of copper on the surface of a wafer as a function of time depends, in part, upon the amount of copper which is contributed by the polishing process and, in part, upon the boron concentration of the wafer. As the boron concentration of the wafer increases, the "storage" capacity for copper and the potential for time-dependent copper surface concentration likewise increase. Subjecting boron doped wafers to a low temperature anneal in acid for a relatively short period of time in accordance with the present invention increases the rate at which the copper-dopant complexes dissociate and copper diffuses to the surface from the bulk of the wafer.

In general, temperatures of less than about 400° C are preferred for the annealing step of the present invention. At temperatures in the range of 400° C. and less, copper has a relatively low solubility in silicon. When the copper-dopant complexes dissociate at temperatures in this range, therefore, the copper rapidly diffuses to surface of the wafer without forming a precipitate; stated another way, the energy barrier for the precipitation reaction is never exceeded and the copper is present on the surface of the wafer in a form in which it, like other copper surface contaminants, can be cleaned from the surface using standard, state of the art cleaning chemistries.

In addition to removing copper from the wafer bulk, the process of the present invention can be used to remove other metals such as nickel, iron, chromium, cobalt, manganese, and zinc from the surface and near surface regions of the wafer, i.e., regions of the wafer which are within 0.01 to 1 micrometer of the surface. Failure to remove these metals prior to heating the wafer can cause the metals to diffuse into the wafer bulk. The depth to which a particular metal may diffuse is a factor of the diffusivity of the metal and the temperature to which the wafer containing the metal is exposed. Fast diffusing metals such as copper and nickel may reach the deep bulk of the wafer even at relatively low temperatures, i.e., temperatures of less than about 60° C. In contrast, slow diffusing metals such as iron, chromium, cobalt, manganese and zinc may diffuse from the surface to a depth of less than about 1 micrometer when exposed to these same temperatures. However, if not removed these metals may, upon being exposed to the high temperatures associated with integrated circuit fabrication, diffuse further into the bulk of the wafer. The presence of metals such as iron in the bulk of the wafer can result in the degradation of bulk electronic properties of the wafer, as well as a reduction in the bulk lifetime of the wafer.

It is preferred, therefore, that metals be removed from the wafer surface simultaneous with the heating of the wafer. In this way, agglomeration and precipitation can be avoided, while also preventing the diffusion of metals present on the surface into the wafer. In accordance with the process of the present invention, therefore, it has been discovered that metallic contaminants may be removed from a nonpatterned silicon wafer by subjecting the wafer to a low temperature anneal, in order to outdiffuse metals to the wafer surface, while simultaneously oxidizing and complexing these metals as they reach the surface and removing them. By maintaining the wafer in an oxidative environment during outdiffusion, residual metals present on the wafer surface are prevented from diffusing into the wafer as the temperature is increased. In addition, this process prevents the agglomeration and precipitation of metals which outdiffuse to the surface because these metals are complexed and removed before such reactions can occur.

Heating of the wafer to outdiffuse metals is achieved by immersing the wafer in a hot acidic solution. The temperature of the acidic solution and the time period during which the wafer is immersed are inversely related, with shorter times being used for higher temperatures and vice versa. Typically, the wafers are annealed at one or more temperatures within the range of about 125° C. to about 400° C. for a duration of about 0.1 to about 10 hours or more, with the shorter times being used for the higher temperatures and vice versa. The wafers are preferably annealed at a temperature of at least about 150° C., more preferably at a temperature of at least about 250° C., and, for some applications, still more preferably at a temperature between about 250° C. and about 400° C. At temperatures in the range of about 125° C. to about 250° C., the annealing time will typically be in the range of about 0.5 to about 10 hours. At temperatures in the range of about 250° C. to about 400° C., the annealing time will typically be in the range of about 0.1 to about 0.5 hours.

In general, any type of acidic solution may be used. However, the solution must be sufficiently acidic in order to oxidize and complex the metallic contaminants which are present. Typically, solutions having a pH of about 4 or less are acceptable. Preferably, the solution will have a pH of less than about 3 and, more preferably, the solution will have a pH of less than about 2. Most preferably, the solution will have a pH of less than about 1. In addition to pH considerations, the components of the acidic solution must also be selected with the understanding that their combination in solution, as well as heating of this combination, must not create hazardous production conditions.

If etching of the wafer surface is a concern, it is preferred that the acid not contain an appreciable amount of hydrogen fluoride. For example, a polished silicon wafer should not be treated by the present process if hydrogen fluoride is present in the acidic solution because the polished surface will be etched. If, however, surface etching is not a concern, then a mixture of an acidic solution and hydrogen fluoride may also be used.

The composition of the acidic solution will depend, in part, upon the desired temperature and duration of heating. In general, the acidic solution will have a boiling point in excess of 125° C. Accordingly, the acidic solution may comprise one or more acids which have boiling points in excess of 125° C., such as concentrated sulfuric acid ($H_2SO_4$, b.p. 388° C.); phosphoric acid ($H_3PO_4$, b.pt. 213° C.); fluorinated derivatives of sulfuric acid and phosphoric acid, such as fluorosulfonic acid ($FSO_3H$, b.pt. 165° C.) and trifluorosulfonic acid (b.pt. 162° C.); perchloric acid dihydrate ($HClO_4.2H_2O$, b.pt. 203° C.); propionic acid (b.pt. 141° C.) and its derivatives; butyric acid (b.pt. 165° C.) and its derivatives; pentanoic acid (b.pt. 186° C.) and its derivatives; and derivatives of acetic acid having boiling points in excess of about 125° C. The acidic solution may additionally include one or more acids having a boiling point of less than 125° C., such as difluorophosphoric acid (b.pt. 116° C.), hydrochloric acid (HCl, b.pt. 108° C.), and nitric acid ($HNO_3$, 68% solution, b.pt. 121° C.).

In one embodiment of the present invention, the acidic solution comprises concentrated sulfuric acid which is preferred because its low vapor pressure allows a process temperature of about 380° C. to be used. Concentrated phosphoric acid, which boils at about 213° C., as well as mixtures of phosphoric and sulfuric acids, are also preferred because they too allow for the use of higher temperatures.

The process of the present invention affords a means by which to remove fast diffusing metals, such as copper and nickel, from the bulk of the wafer. It is to be noted that the present process also affords a means by which to remove slow diffusing metals, such as iron, chromium, cobalt, manganese and zinc from regions near the surface of the wafer, i.e., regions less than about 1 micron from the surface, under these same process conditions. Typically, the latter group of metals will not be found in the bulk of the wafer due to their low diffusivity and, therefore, these conditions are sufficient for their removal.

When annealing of the silicon wafer is complete, the wafer is then removed from the acidic solution and rinsed with water, typically by using a quick dump rinse bath or an overflow rinse bath, in order to remove traces of the acidic solution which remain from the surface of the wafer. The wafer may then proceed to the next step of the manufacturing process, such as to a RCA-type cleaning method which is standard in the art (see, e.g., F. Shimura, *Semiconductor Silicon Crystal Technology*, Academic Press, 1989, pp. 188–191 and Appendix XII), or to a hydrogen fluoride treatment which strips the surface oxide layer that has been formed.

The process of the present invention may be performed on any type of nonpatterned silicon wafer in order to effectively complex and remove metallic contaminants. Stated another way, the process is preferably carried out on polished wafers, i.e., wafers having a bare silicon face (except for a native silicon dioxide layer which is invariably present on silicon exposed to air) which has been polished to provide a specular finish thereon and not on patterned wafers, i.e., wafers onto which an organic material, metal or other material has been deposited or otherwise formed on less than the entire surface of the wafer using a mask or other comparable means. In addition, the process may be performed at any stage prior to initiation of integrated circuit fabrication. Preferably, the process is carried out after surface polishing has been completed due to the fact that the polishing process is known to cause copper contaminants to diffuse into the bulk of the wafer (see, e.g., *J. Electrochem. Soc.*, 138 (1991), pp. 1385–89).

As illustrated by the Example, set forth below, the process of the present invention may be used to diffuse metallic contaminants to the surface of a silicon wafer and remove them from the wafer surface by oxidation and complexation before agglomeration and precipitation can occur, thereby preventing damage to the wafer surface. Although exposure to an acidic solution at elevated temperatures for an extended period of time may result in some degradation of the wafer surface, experience has shown that surface degradation resulting from the process of the present invention is limited. For example, results from light point defect analyses of wafers subjected to the present process indicate that the sum of all light scattering events greater than about 0.12 microns is increased by no more than about 20 percent. Therefore, wafers prepared in accordance with the present process are suitable for use by integrated circuit manufacturers.

The Example sets forth only one set of conditions to be used to achieve the desired results. Accordingly, the Example should not be interpreted in a limiting sense.

EXAMPLE

In accordance with the process of the present invention, a test set of four p+ type silicon wafers was immersed for about 1 hour in an acidic solution heated to about 125° C., the acidic solution containing about 4% nitric acid (70% solution) and about 96% concentrated sulfuric acid. After being removed from the acidic solution, the test set and a control set of four wafers were subjected to a standard RCA-type cleaning method. (See, e.g., F. Shimura, *Semiconductor Silicon Crystal Technology*, Academic Press, 1989, pp. 188–191 and Appendix XII, incorporated herein by reference.)

Referring now to Table 1 (below) and FIG. 1, after cleaning both the test set (denoted "hot acid") and control set (denoted "control") were analyzed for surface and very near surface (i.e., about 0.01 micron from the surface) copper concentrations, or levels, using AA (atomic absorption) and ICP/MS (inductively coupled plasma/mass spectroscopy) methods of analysis, both of which are standard in the art. (See, e.g., G. W. Ewing, *Instrumental Methods of Chemical Analysis*, McGraw Hill, 1985.) The results indicate that the wafers which were subjected to the present process have a lower copper concentration.

TABLE 1

| Sample Set | Copper Conc. ($1 \times 10^{10}$ atoms/cm$^2$) | |
|---|---|---|
| | Average | σ |
| Control | 0.212 | 0.136 |
| Control/bake-out | 0.580 | 0.139 |
| Hot Acid | 0.016 | 0.004 |
| Hot Acid/bake-out | 0.358 | 0.137 |

Referring now to Table 2 (below), both sets of wafers where also analyzed to determine the concentration of others metals in the surface and near surface regions after cleaning. As the results indicate, the wafers which were subjected to the present process have a lower concentration of other metals as well, including iron, chromium, cobalt, nickel and zinc, among others.

TABLE 2

| | lot-A | Ca | Fe | Na | Mg | Al | Ti | Cr | Mn | Co | Ni | Cu | Zn |
|---|---|---|---|---|---|---|---|---|---|---|---|---|---|
| control | ave. | 0.944 | 0.336 | 9.785 | 1.112 | 1.963 | 0.190 | 0.069 | 0.030 | −0.007 | 0.873 | 0.212 | 0.239 |
| | σ | 0.889 | 0.282 | 2.552 | 0.526 | 0.807 | 0.037 | 0.013 | 0.023 | 0.015 | 0.626 | 0.136 | 0.058 |
| hot acid | ave. | 0.333 | 0.170 | 7.605 | 0.870 | 2.304 | 0.165 | 0.058 | 0.030 | −0.020 | 0.738 | 0.016 | 0.191 |
| | σ | 0.177 | 0.154 | 1.065 | 0.263 | 2.040 | 0.021 | 0.015 | 0.009 | 0.004 | 0.213 | 0.004 | 0.028 |

It is to be noted that the results indicate the concentration of aluminum actually increased as a result of the process. However, historically analytical methods have had difficultly in providing consistent data on aluminum contents. For a small set of samples such as this, a single anomalous data point can create a misleading result. Such is the case here, as indicated by the high standard deviation (denoted "σ") for the test set, as compared to the control set.

Once the analyses were complete, both sets of wafers where placed in an oven for about 1 hour at about 120° C. in an attempt to further outdiffuse any copper which remained in the bulk of the wafers. The wafers were then once again analyzed for surface and near surface copper concentration. Referring again to Table 1 and FIG. 1, the results indicate the wafers which were subjected to the present process (denoted "hot acid/bake-out") had a lower copper concentration than the control wafers (denoted "control/bake-out"). These results confirm that copper was successfully outdiffused from the bulk of the wafer and removed.

As various changes could be made in the above method without departing from the scope of the present invention, it is intended that all matter contained in the above description shall be interpreted as illustrative and not in a limiting sense.

What is claimed is:

1. A process for annealing a nonpatterned silicon wafer to remove copper or nickel from the wafer bulk, the process comprising immersing the wafer for at least about 0.1 hours in an acidic solution heated to a temperature of at least about 125° C. to diffuse copper or nickel from the wafer bulk to the surface of the wafer, oxidizing and complexing the diffused copper or nickel at the wafer surface, and removing the oxidized copper or nickel complex from the wafer surface.

2. The process as set forth in claim 1 wherein the wafer is immersed for about 0.5 hours to about 10 hours in an acidic solution heated to a temperature ranging from about 125° C. to about 250° C.

3. The process as set forth in claim 1 wherein the wafer is immersed for about 0.1 hours to about 0.5 hours in an acidic solution heated to a temperature ranging from about 250° C. to about 400° C.

4. The process as set forth in claim 1 wherein the acidic solution has a pH of about 4 or less.

5. The process as set forth in claim 4 wherein the acidic solution has a pH of about 2 or less.

6. The process as set forth in claim 5 wherein the acidic solution comprises sulfuric acid.

7. The process as set forth in claim 1 wherein copper is diffused from the wafer bulk.

8. The process as set forth in claim 1 wherein the wafer is immersed in the acidic solution to diffuse iron, chromium, cobalt, manganese or zinc to the wafer surface from a depth of less than about 1 micron, as measured from the wafer surface.

9. The process as set forth in claim 8 wherein iron is diffused to the wafer surface.

10. The process as set forth in claim 1 wherein nickel is diffused from the wafer bulk.

11. The process as set forth in claim 1 wherein the nonpatterned silicon wafer is boron doped.

12. A process for annealing a nonpatterned silicon wafer to remove copper or nickel from the wafer bulk; the process comprising immersing the wafer in an acidic solution heated to a temperature of at least about 150° C. to diffuse copper or nickel from the wafer bulk to the surface of the wafer, oxidizing and complexing the diffused copper or nickel at the wafer surface, and removing the oxidized copper or nickel complex from the wafer surface.

13. The process as set forth in claim 12 wherein the wafer is immersed for about 0.1 hours to about 0.5 hours in an acidic solution heated to a temperature ranging from about 250° C. to about 400° C.

14. The process as set forth in claim 12 wherein the acidic solution has a pH of about 4 or less.

15. The process as set forth in claim 14 wherein the acidic solution has a pH of about 2 or less.

16. The process as set forth in claim 15 wherein the acidic solution comprises sulfuric acid.

17. The process as set forth in claim 12 wherein copper is diffused from the wafer bulk.

18. The process as set forth in claim 12 wherein the wafer is immersed in the acidic solution to diffuse iron, chromium, cobalt, manganese or zinc to the wafer surface from a depth of less than about 1 micron, as measured from the wafer surface.

19. The process as set forth in claim 18 wherein iron, is diffused to the wafer surface.

20. The process as set forth in claim 12 wherein nickel is diffused from the wafer bulk.

21. The process as set forth in claim 12 wherein the nonpatterned silicon wafer is boron doped.

22. A process for preparing a nonpatterned silicon wafer having a polished surface wherein copper, present on the polished surface and in the wafer bulk, is removed, the process comprising polishing a surface of the nonpatterned wafer, the polishing process contributing copper to the surface and bulk of the wafer, immersing the polished wafer for at least about 0.1 hours in an acidic solution heated to a temperature of at least about 125° C. to diffuse copper from the wafer bulk to the surface of the wafer, oxidizing and complexing the diffused copper at the wafer surface, and removing the oxidized copper complex from the wafer surface.

23. The process as set forth in claim 22 wherein the nonpatterned silicon wafer is boron doped.

24. The process as set forth in claim 23 wherein the wafer is immersed for about 0.1 hours to about 0.5 hours in an acidic solution heated to a temperature ranging from about 250° C. to about 400° C.

* * * * *